(12) United States Patent
Paumier et al.

(10) Patent No.: US 7,640,482 B2
(45) Date of Patent: Dec. 29, 2009

(54) BLOCK PROCESSING IN A BLOCK DECODING DEVICE

(75) Inventors: Laurent Paumier, Grenoble (FR); Vincent Heinrich, La Tronche (FR)

(73) Assignee: STMicroelectronics SA, Montrouge (FR)

( * ) Notice: Subject to any disclaimer, the term of this patent is extended or adjusted under 35 U.S.C. 154(b) by 644 days.

(21) Appl. No.: 11/470,982

(22) Filed: Sep. 7, 2006

(65) Prior Publication Data
US 2007/0089020 A1   Apr. 19, 2007

(30) Foreign Application Priority Data
Sep. 12, 2005   (FR) ................... 05 09284

(51) Int. Cl.
*G11C 29/00* (2006.01)
(52) U.S. Cl. ..................................... 714/767
(58) Field of Classification Search .............. 714/746, 714/763, 767, 800, 805
See application file for complete search history.

(56) References Cited

U.S. PATENT DOCUMENTS

| | | | |
|---|---|---|---|
| 6,252,917 B1 | 6/2001 | Freeman | 375/340 |
| 6,381,728 B1 * | 4/2002 | Kang | 714/781 |
| 6,624,767 B1 | 9/2003 | Shiu et al. | 341/81 |
| 7,275,203 B2 | 9/2007 | Martinez et al. | 714/752 |
| 7,318,186 B2 | 1/2008 | Yokokawa et al. | 714/758 |

FOREIGN PATENT DOCUMENTS

| | | |
|---|---|---|
| DE | 102 14 393 A1 | 2/2003 |
| EP | 0 973 292 A2 | 1/2000 |
| EP | 1 521 372 A1 | 4/2005 |

OTHER PUBLICATIONS

"Digital Video Broadcasting (DVB); Second generation framing structure, channel coding and modulation systems for Broadcasting, Interactive Services, News Gathering and other broadband satellite applications; ETSI EN 302 307" ETSI Standards, European Telecommunications Standards Institute, Sophia-Antipo, FR. vol. BC, No. V1.1.1, Mar. 2005, 74 pages.

* cited by examiner

*Primary Examiner*—Shelly A Chase
(74) *Attorney, Agent, or Firm*—Lisa K. Jorgenson; Robert Iannucci; Seed IP Law Group PLLC

(57) ABSTRACT

A device for storing blocks of bits intended to be decoded according to a block decoding algorithm. The blocks are likely to belong to a given category out of a first category and a second category. The first category corresponds to a first given block size, and the second category corresponds to at least one second given block size less than said first block size. The storage device comprises three storage elements having a size suitable for storing one block of the first category each, and at least two of which are structured to store either one block of the first category, or one block of the second category or a number of blocks of the second category simultaneously.

16 Claims, 7 Drawing Sheets

US 7,640,482 B2

BLOCK PROCESSING IN A BLOCK DECODING DEVICE

BACKGROUND OF THE INVENTION

1. Field of the Invention

The present invention relates to the field of block decoding.

2. Description of the Related Art

Channel encoding or forward error correction (FEC) consists in adding redundancy to information data to be transmitted over a noise-affected channel or to be stored on a medium likely to be damaged, such as a CD-ROM. On reception or reading, the redundant data may be used to retrieve the information data.

With reference to FIG. 1, a typical generic transmission subsystem contains, on the side of the sender 10, a data source 11 (DAT_SRC), followed by a source encoder 12 (SRC_ENC), a channel encoder 13 (CH_ENC), and finally a modulator 14 (MOD). The source encoder 12 compresses the information data (for example, according to one of the MPEG, H264, or other standards) so as to reduce the bit rate of the data to be transmitted. The channel encoder 13 adds redundancy so that, on the side of the receiver 30, the potential errors due to the noise N introduced on the transmission channel 20 may be corrected. The modulator 14 adapts the signal to the transmission channel (for example, satellite transmission channel, radio transmission channel, etc.). On the side of the receiver 30, a demodulator 34 (DEMOD), followed by a channel decoder 33 (CH_DEC) and a source decoder 32 (SRC_DEC), perform operations corresponding to those handled by the modulator 14, the channel encoder 13 and the source encoder 12, respectively. The demodulated and decoded data is then restored to the entity that uses the data 31 (DAT_U).

Among the currently known error correction codes, the block-mode codes consist in adding, to each message of K information bits, a determined number (N-K) of redundancy bits, so as to form code words of N bits.

Typical block-mode channel encoding algorithms include the BCH (Bose-Chaudhuri-Hocquenghem) code, the Hamming code and even the LDPC (Low Density Parity Check) codes.

The LDPC codes are a class of FEC codes invented in 1960 by Robert Gallager, which constitutes an alternative to the Viterbi codes, and to the more recent turbocodes. The first commercial standard prescribing the use of an LDPC code is the DVB-S2 standard, that is, the second generation standard for digital satellite television, published by the ETSI (European Telecommunication Standardization Institute) and incorporated herein in its entirety.

An LDPC encoder processes messages of K information bits, and delivers as output code words of N bits, with N>K. In other words, it adds N-K redundancy bits which are used, on the receiving side, to correct the transmission errors. These N-K bits are called parity bits.

The N-K bits added to each message of K information bits are computed using an H matrix, called parity check matrix. This H matrix has N-K rows and N columns. It contains zeroes and ones, with a small proportion of ones, which is why the codes based on such a parity matrix are called low density parity check codes. For example, the H matrix may contain 48600 rows and 64800 columns, that is K=16200 and N=64800.

With reference to FIG. 2, an N-bit LDPC code word, in which the K low order bits correspond to the information bits and in which the N-K high order bits correspond to the parity bits, satisfies the relation:

$$H \times C^t = 0 \quad (1)$$

On the receiver side, the LDPC decoder corrects the errored bits based on the blocks received via the transmission channel. Each block corresponds to a code word sent over the transmission channel. Each bit sent has a corresponding logarithmic likelihood ratio (LLR). Each LLR is encoded on a number m of bits, for example 6 bits.

A block therefore comprises N*m bits, or for example 64800*6 bits.

For a bit d sent for which there is a corresponding signal y received by the LDPC decoder after the addition of a noise on the transmission channel, the LLR ratio of the bit d relative to the signal y is defined by:

$$LLR(y) = LLR(d/y) = \ln\frac{P(d=0/y)}{P(d=1/y)}$$

in which P(d=0/y) is the probability that the bit d sent is equal to 0 according to the value y received, and P(d=1/y) is the probability that the bit d sent is equal to 1 according to the value y received.

The LDPC decoder uses internal metrics, of a number equal to the number of "1" values in the H matrix, and each encoded on a number t of bits. It updates these metrics according to an iterative algorithm.

In an initialization step, each internal metric $e_{jk}$ is assigned the value of the LLR $LLR_k$ corresponding to the column of this internal metric.

With reference to FIG. 3, each iteration comprises update steps performed by rows, then update steps performed by columns.

Each update step performed by row consists in determining for each internal metric $e_{3,k}$ a first new value $e_{3,k}^{(1)}$ according to the values of the other internal metrics ($e_{3,1}, e_{3,2}, \ldots, e_{3,k+1}, \ldots, e_{3,N-1}$) of the same row. The update step performed by row uses the relation (1).

Each update step performed by column consists in determining for each internal metric, for example $e_{3,k}$, a second new value $e_{3,k}^{(2)}$ taking into account the first new values of the internal metrics of the same column ($e_{4,k}^{(1)}$) and the LLR $LLR_k$ corresponding to this column.

To decode a received LDPC block, the decoder performs a number of iterations, for example around fifty iterations. Each internal metric converges towards a given value.

The decoded bits, called hard decision bits, are then obtained by adding the internal metrics by column with the received LLRs. For each column, the corresponding LLR $LLR_k$ and the values of the internal metrics after, for example, 50 iterations ($e_{3,k}^{(100)}, e_{4,k}^{(100)}$) are summed. The sign of the sum is used to determine, in a decision step, the value of the decoded bit.

In such a decoding method, the values of the LLRs are used in the initialization step, on each iteration and in the decision step.

With reference to FIG. 4, the typical architecture of an LDPC decoder according to the prior art comprises an input memory or channel memory 41 (denoted CH_MEM in FIG. 4), capable of storing a number 2×N of LLRs. More particularly, the memory 41 comprises a first buffer 41a for storing the N LLRs of the block previously received and which is currently being decoded, and a second buffer 41b for storing the N LLRs of a block currently being received.

The LLRs may be supplied in a roughly continuous manner by a demodulator (not shown). The time to decode a block is less than the time separating the start of provision of two blocks, in order to avoid saturating the input memory 41. Now, the shorter the time separating the start of provision of two blocks, the higher the bit rate can be. The time to decode a block is therefore normally close to the time separating the start of provision of two blocks, while being less than this time separating the start of provision of two blocks.

The decoder also includes processing means. In order to speed up the computations associated with decoding, said processing means comprise a bank of P processors 42. These P processors (denoted Proc1 to ProcP in FIG. 4), perform parallel update computations by row and by column. The number P is called the parallelism index.

While the iterative process is being executed, the processors deliver internal metric update values, each encoded on t bits. The internal metrics are stored in a metrics memory 43 (denoted MET_MEM in FIG. 4). The internal metrics stored in the memory 43 are delivered to the bank of processors 42, via a P-channel mixer, such as a barrel shifter device 44 (denoted BS in FIG. 4) in the case of the DVB-S2 standard. The memory 43 is accessible in write and read modes via respective buses of t×P rows.

After the last iteration, the processors 42 also deliver hard decision bits, which take the value "1" or "0" depending on the sign of the sum on the columns of the H matrix and the corresponding LLRs. These hard decision bits are stored temporarily in an output memory, or hard decision memory 45 (denoted HD_MEM in FIG. 4). The capacity of the memory 45 is equal to N, that is, the size in LLRs of an LDPC block.

Commonly, the blocks received by a storage device are likely to be of several different sizes.

For example, the received blocks may be long blocks of 64800 LLRs or even short blocks of 16200 LLRs. The long blocks occupy approximately four times more space than the short blocks. The processing time required to decode a long block is approximately four times greater than the time needed to process a short block.

The channel memory must therefore be designed to receive blocks likely to be of two different sizes.

FIG. 6 shows an example of channel memory according to the prior art. FIG. 5 shows an example of timing diagrams, one of the timing diagrams representing the writing of the blocks received into the channel memory and the other timing diagram representing the reading on block decoding. The two figures will be explained together.

At the time T0, a first long block $L_1$ is received and written into a first storage element 61 of a first type. The storage elements of this first type have a size suitable for storing a long block. When the write phase is finished, the first long block $L_1$ is processed for decoding purposes, for example by a BCH or LDPC decoding algorithm.

In this example, this first long block $L_1$ is followed by a first short block $S_1$. This first short block $S_1$ is stored in a first storage element 63 of a second type. The storage elements of this second type have a size suitable for storing a short block. The storage capacity of a storage element of the second type is therefore approximately four times less than the storage capacity of a first storage element of the first type.

If, at the time T2, a second short block $S_2$ is received, it must be stored in a second storage element of the second type 64. At the time T2, the first storage element of the second type 63 is still full. Furthermore, a second storage element of the first type 62 must remain free for the case where this second short block $S_2$ is followed by a long block.

Similarly, assuming that the second short block $S_2$ is followed by two more short blocks ($S_3$, $S_4$), these short blocks must be stored respectively in two storage elements of the second type (65, 66).

The processing of the first long block $L_1$ ends roughly at the time T5. If at the time T5, a fifth short block $S_5$ is received, it may be stored in one or other of the storage elements of the first type (61, 62).

At least four storage elements of the second type (63, 64, 65, 66) are therefore needed to be able to receive blocks likely to be of two different sizes.

More generally, if the ratio of the block sizes is R, R storage elements of the second type will be needed.

Furthermore, the blocks may be likely to be of more than two different sizes.

For example, the received blocks may be long blocks of 64800 LLRs, short blocks of 16200 LLRs, or very short blocks of 8100 LLRs. The channel memory capable of receiving these blocks comprises:

two storage elements of a first type having a size suitable for storing a long block, four storage elements of a second type having a size suitable for storing a short block, and eight storage elements of a third type having a size suitable for storing a very short block.

When a bank of P processors is used to perform the decoding computations, and each LLR is encoded on m bits, each storage element (61, 62, 63, 64, 65, 66) is connected to a multiplexer 67 by P*m wires. This gives more than 2000 wires for each storage element given a value of P equal to 360 and a value of m equal to 6. Routing these wires may prove difficult.

BRIEF SUMMARY OF THE INVENTION

One embodiment of the present invention simplifies the routing of the storage element wires while enabling the channel memory to receive blocks likely to be of several different sizes.

According to a first embodiment, a device for storing blocks of bits intended to be decoded according to a block channel decoding algorithm is described. The blocks are likely to belong to a given category out of a first category and a second category, the first category corresponding to a first given block size, the second category corresponding to at least one second given block size less than said first size. Said storage device comprises three storage elements having a size suitable for storing one block of the first category each, and at least two of which are structured to store either one block of the first category, or one block of the second category or a number of blocks of the second category simultaneously.

Thus, certain storage elements may be used to store interchangeably a block of the first category or one or more blocks of the second category.

According to this embodiment, the storage device comprises a relatively small number of storage elements, so making it possible to simplify the routing of the wires linked to the storage elements.

The storage elements may operate with a multiplexer that is simpler than the multiplexer of the prior art, because of the smaller number of storage elements to be managed.

Furthermore, according to the first embodiment, the storage device makes it possible to achieve savings in surface area and consumption.

In one embodiment, the first block size is at least two times greater than the at least one second block size. Said at least two storage elements may be structured to store either one block of the first category or a number of blocks of the second category simultaneously. Thus, when a plurality of short blocks are received in succession, a number of short blocks may be stored in the same storage element.

According to a second embodiment, a system for decoding blocks of bits according to a block-mode channel decoding algorithm is described. The system comprises a storage device according to the first embodiment. The decoding system further comprises a bank of processors for processing the received blocks, a loop and a decision memory for temporarily storing the value of the decoded bits. The loop comprises a memory for storing intermediate data originating from the bank of processors, and a mixer for preparing data to be processed by the bank of processors from the intermediate data.

Such a storage device may be used to receive the blocks of LLRs and process them according to an iterative decoding algorithm to retrieve the values of the bits sent.

In one embodiment, the decoding system may be implemented in system on chip (SoC) form. The present invention is not, of course, limited to such an implementation.

According to a third embodiment, a method of storing blocks of bits intended to be decoded according to a block-mode channel decoding algorithm is described. The blocks are likely to belong to a category out of a first category and a second category, the first category corresponding to a first given block size, the second category corresponding to at least one second given block size less than said first size. Three storage elements are provided, the storage elements each having a size suitable for storing one block of the first category. At least two of said storage elements are structured to store either one block of the first category, or one block of the second category or a number of blocks of the second category simultaneously. For each new block, a storage element is chosen out of said three storage elements, the choice being made on the basis of the size of the new block.

This method may be implemented using the storage device according to one embodiment of the invention and therefore presents at least the same advantages compared to the prior art.

In particular, for a new block belonging to the second category, it is possible to choose a storage element out of said at least two storage elements structured to store simultaneously a number of blocks of the second category. The choice may, for example, be made on the basis of the value of an index, said index being representative of the fill ratio of said at least two storage elements.

The present invention is by no means limited by said index: the choice may be made according to the values of other parameters.

BRIEF DESCRIPTION OF THE SEVERAL VIEWS OF THE DRAWING(S)

Other features and advantages of the present invention will become apparent from the description that follows.

FIG. 1, already described, is a diagram of an exemplary transmission subsystem according to the prior art.

FIG. 2, already described, shows an exemplary H parity matrix and a code word C, in a known LDPC algorithm.

FIG. 3, already described, partially illustrates a known LDPC decoding method.

FIG. 4, already described, is a diagram of an exemplary known LDPC decoding device.

FIG. 5, already described, shows an example of timing diagrams according to the prior art, one of the timing diagrams representing the writing of the received blocks into the channel memory and the other timing diagram representing the reading on block decoding.

FIG. 6, already described, shows an example of channel memory according to the prior art.

Figure 7:
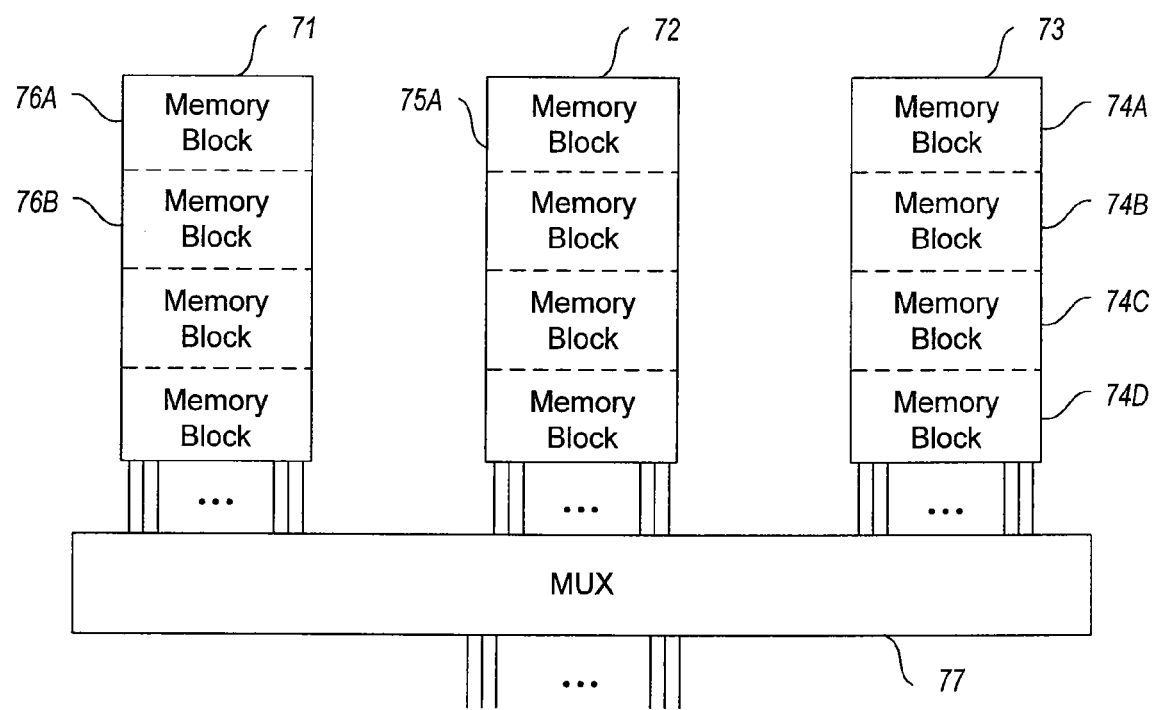
FIG. 7 shows an example of channel memory according to at least one embodiment.
Figure 8:
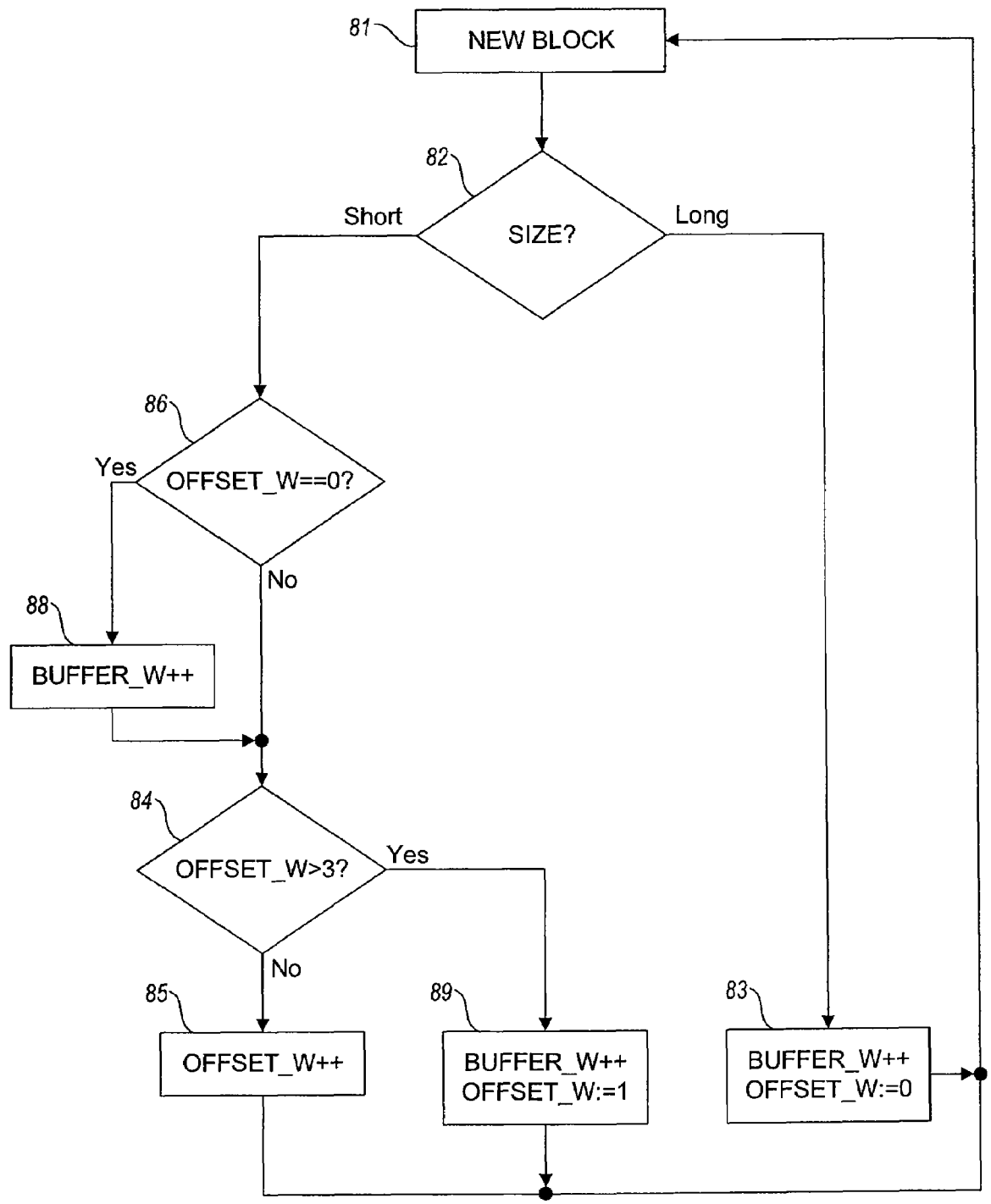
FIG. 8 shows an example of channel memory storage element management algorithm, according to the embodiment of FIG. 7.
Figure 9:
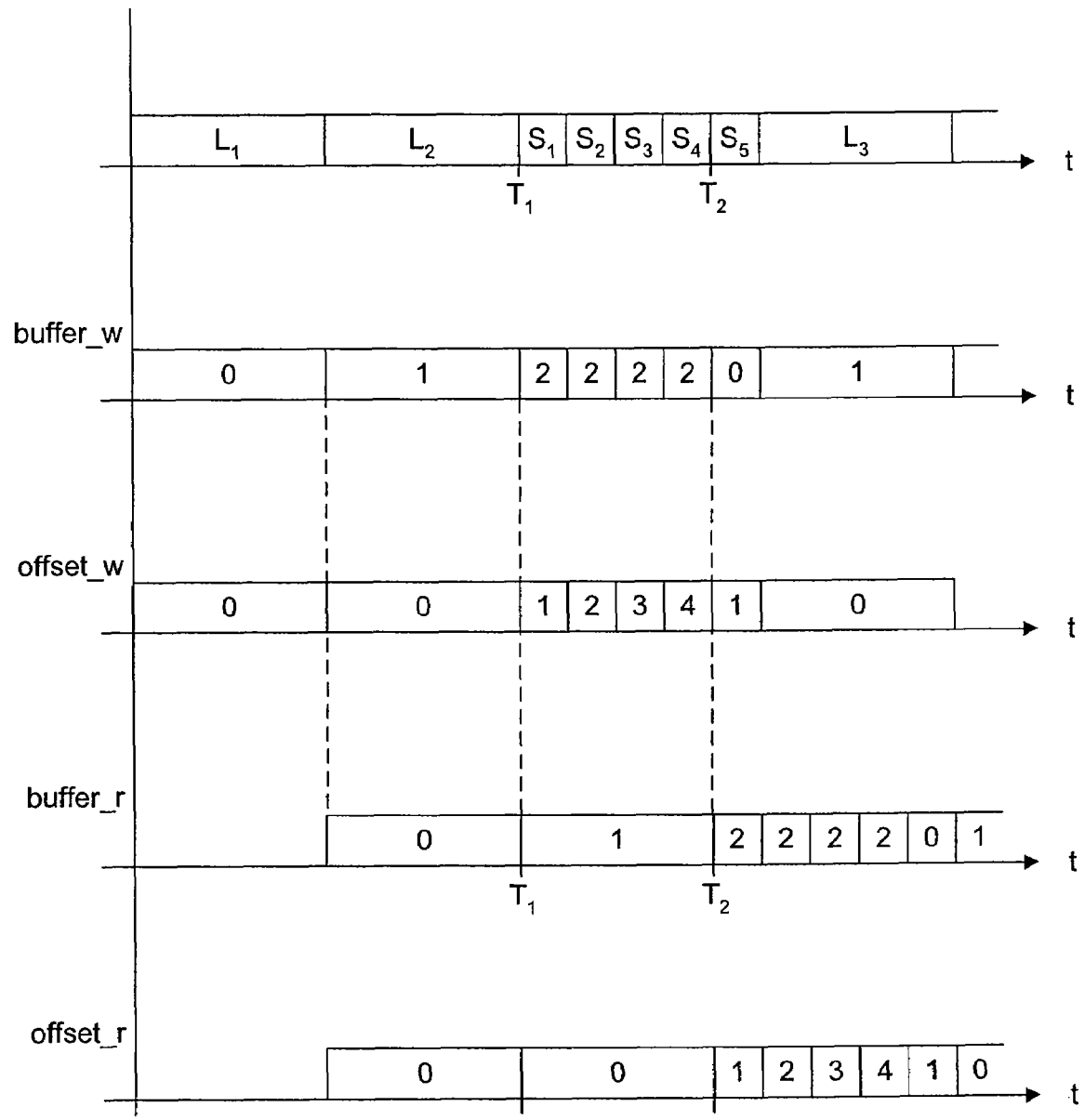
FIG. 9 shows an example of timing diagrams for the management of the storage elements, according to the embodiment of FIG. 7.

FIGS. 7, 8 and 9 correspond to the same embodiment of the invention and will be described together.

DETAILED DESCRIPTION OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with block decoders have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Further more, the particular features, structures, or characteristics may be combined in any suitable manner in one or more embodiments.

The headings provided herein are for convenience only and do not interpret the scope or meaning of the embodiments.

In at least one embodiment, information data encoded according to an LDPC algorithm has been sent over a noise-affected channel. For a code word sent, there is a corresponding block received via the channel. Each bit of the code word has a corresponding logarithmic likelihood ratio or LLR. Each LLR is encoded on a number m of bits, for example 6 bits.

A system on chip handles correction of the errored bits based on received blocks. The decoding is performed according to an iterative LDPC decoding algorithm.

In at least one embodiment, the received blocks are likely to be of two sizes.

The blocks received are likely to belong to a first category or to a second category. The first category corresponds to a first given block size, for example 64800 LLRs. The second category corresponds here to a single second block size. The second block size is less than the first block size. The second block size may, for example, be 16200 LLRs. The term "long blocks" is used to denote the blocks belonging to the first category and the term "short blocks" is used to denote the blocks belonging to the second category.

The long blocks occupy approximately four times more space than the short blocks. The processing time needed to decode a long block is approximately four times greater than the time needed to process a short block.

A device for storing such blocks comprises a channel memory represented in FIG. 7. The channel memory comprises a multiplexer 77 and three storage elements (71, 72, 73). These three storage elements have a size suitable for storing a long block.

In at least one embodiment, each storage element (71, 72, 73) comprises eight random access memory (RAM) elements. Each random access memory element may be used to store 180 words of 270 bits. Each storage element may therefore be used to store approximately 388800 bits, that is, for 6-bit LLRs, the number of bits of a block of 64800 LLRs.

The device is not, of course, limited by the nature of the storage elements. Registers may, for example, be used.

In at least one embodiment, each storage element (71, 72, 73) is structured to simultaneously store four short blocks. Each storage element is structured as four subspaces (74A, 74B, 74C, 74D, 75A, ..., 76A, 76B, ...). Each subspace may be used to store one short block.

When a new block is received (step 81 in FIG. 8), a storage element is chosen from the three storage elements (71, 72, 73). The choice is based on the size of the new block. The algorithm for managing storage elements comprises, for this purpose, a first test step 82. This test step 82 may include a step, not shown, for reading the value of a size field.

If said value indicates that the received block is a long block, the new block is stored in an empty storage element (step 83 in FIG. 8).

If said value indicates that the received block is a short block, the new block may be stored in a storage element that is already partially filled. The choice of the storage element in which the new block is stored is based on the value of an index offset_w. Said index offset_w is representative of the fill ratio of the storage elements.

The timing diagrams of FIG. 9 more clearly illustrate the storage element management algorithm of FIG. 8.

The first timing diagram of FIG. 9 represents the blocks received over time.

The second timing diagram represents the values of a first variable buffer_w. The first variable buffer_w is representative of the storage elements chosen to store the received blocks.

The third timing diagram represents the values of the index offset_w.

The fourth timing diagram represents the values of a second variable buffer_r. The second variable buffer_r is representative of the storage elements for which the stored values are read on execution of the block-mode channel decoding algorithm.

Finally, the fifth timing diagram represents the values of a read index offset_r. The read index offset_r is representative of the position in storage elements of the bits read on executing the block-mode channel decoding algorithm.

In the example represented in FIG. 9, a first long block $L_1$ is received. Assume that the first variable buffer_w is initially set to two, and the index offset_w the second variable buffer_r and the read index offset_r are initially set to zero.

The choice of the storage element to store the first long block $L_1$ is based on the size of the received block (test step 82 in FIG. 8). The first variable buffer_w is incremented and the index offset_w kept at zero (step 83 in FIG. 8). In the algorithm of FIG. 8, the increments of the first variable buffer_w are made modulo 3. Also, the first variable buffer_w takes a value equal to zero.

The first long block $L_1$ is therefore stored in the storage element corresponding to a zero value of the first variable buffer_w for example a first storage element 71.

The index offset_w is representative of the fill ratio of the storage elements: in this case, the storage elements are either empty or fully filled. The index offset_w is therefore zero.

In the example of FIG. 9, a second long block $L_2$ is then received. After the first test step 82, the first variable buffer_w is incremented to one and the index offset_w kept at zero (step 83 in FIG. 8). The value of the first variable buffer_w indicates the storage element in which the second long block $L_2$ is stored, for example, a second storage element 72.

During this time, the LLRs stored in the first storage element 71 are read and processed by an LDPC decoding algorithm. An LDPC decoder, such as, for example, the decoder represented in FIG. 4, may be used for this purpose, except that the channel memory at present comprises three storage elements. The second variable buffer_r has taken the value of the first variable buffer_w. At the time T1, the processing of the LLR bits is finished and the first storage element 71 is available for reuse.

Assume that a first short block $S_1$ is then received. After the first test step 82, a second test step 86 is performed. The value of the index offset_w is compared to zero. If the value of the index offset_w is equal to zero, the first variable buffer_w is incremented, that is, the block is stored in a new storage element, in this case, a third storage element 73. Here, too, the incrementing of the first variable buffer_w is understood to be modulo 3.

A third test step 84 is then performed. The value of the index offset_w is compared to a threshold, in this case three. If the value of the index offset_w is less than or equal to this threshold, the index offset_w is incremented (step 85).

In practice, the first short block $S_1$ stored in a third storage element 73 only partially fills the third storage element 73. The index offset_w representative of the fill ratio of the storage elements therefore takes a value indicating that the third storage element 73 is partially filled.

Assume that a second short block $S_2$ is then received. After the first test step 82, the second test step 86 is carried out. This time, the value of the index offset_w is non-zero, so that the first variable buffer_w keeps a value equal to two. The second short block $S_2$ is thus stored in the same storage element as the first short block $S_1$.

In the third test step 84, the value of the index offset_w is compared to three. Since the value of the index offset_w is then equal to one, it is incremented (step 85). The value of the index offset_w is then equal to two and indicates that the third storage element 73 is half filled after storing the second short block $S_2$.

Similarly, a third short block $S_3$ may then be received and stored in the third storage element 73. The first variable buffer_w keeps a value equal to two. The value of the index offset_w is then equal to three and indicates that the third storage element 73 is three quarters filled after storing the third short block $S_3$.

If a fourth short block $S_4$ is then received, the first variable buffer_w keeps a value equal to two. The value of the index offset_w goes to four and indicates that the third storage element 73 is entirely filled after storing the fourth short block $S_4$.

While the short blocks $S_1, S_2, S_3$ and $S_4$ were received, the LLRs of the second storage element 72 were read and processed by an LDPC decoding algorithm. At the time T2, the second storage element 72 is once again available.

Assume that a fifth short block $S_5$ is then received. When the third test step 84 is carried out, the value of the index offset_w is greater than three. The first variable buffer_w is then incremented, therefore going to zero, and the index offset_w is assigned a value of one (step 89). The fifth short block $S_5$ is therefore stored in the first storage element 71 of which it occupies approximately only a quarter.

Assume that a third long block $L_3$ is then received. After the first test step 82, the first variable buffer_w is incremented, therefore going to one, and the index offset_w reset to zero (step 83). The third long block $L_3$ is therefore stored in a new storage element, in this case the second storage element 72.

During this time, the second variable buffer_r and the read index offset_r respectively copy the value of the first variable buffer_w and the index offset_w. The LLRs of the third storage element 73 are then read and processed block by block. The values of the read index offset_r are used to indicate the positions of the block to be read in the third storage element 73.

Thus, it is possible to manage the storage of blocks likely to be of two different sizes with just three storage elements.

In addition to the channel memory represented in FIG. 7, the storage device includes a decoding device. The decoding device is used to apply the channel decoding algorithm, in this case LDPC.

Figure 1:
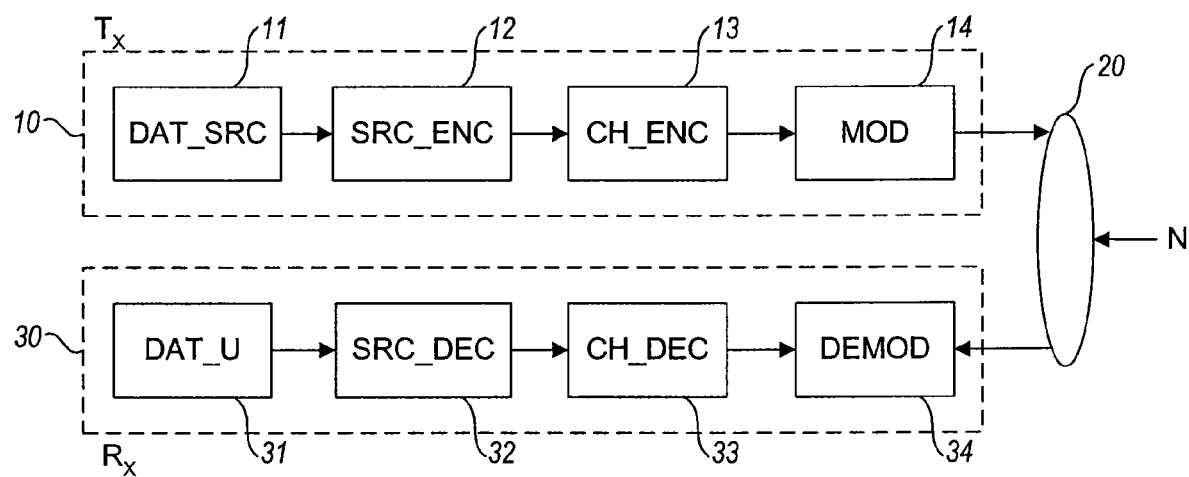
Figures 2, 3:
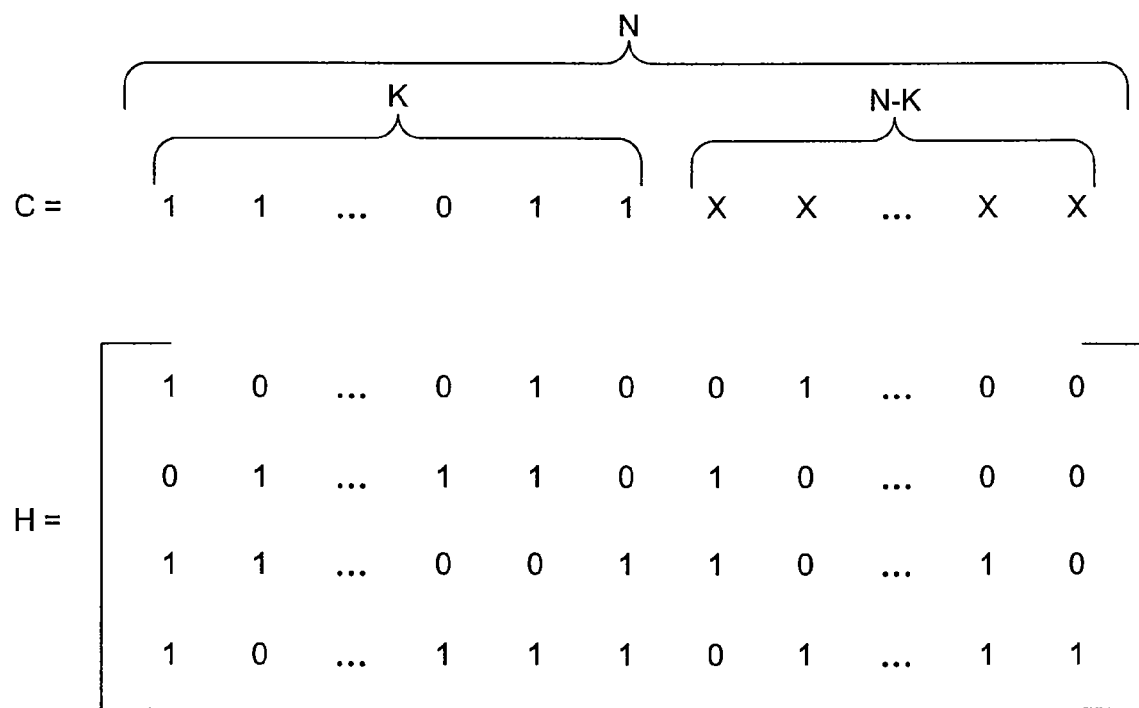
Figure 4:
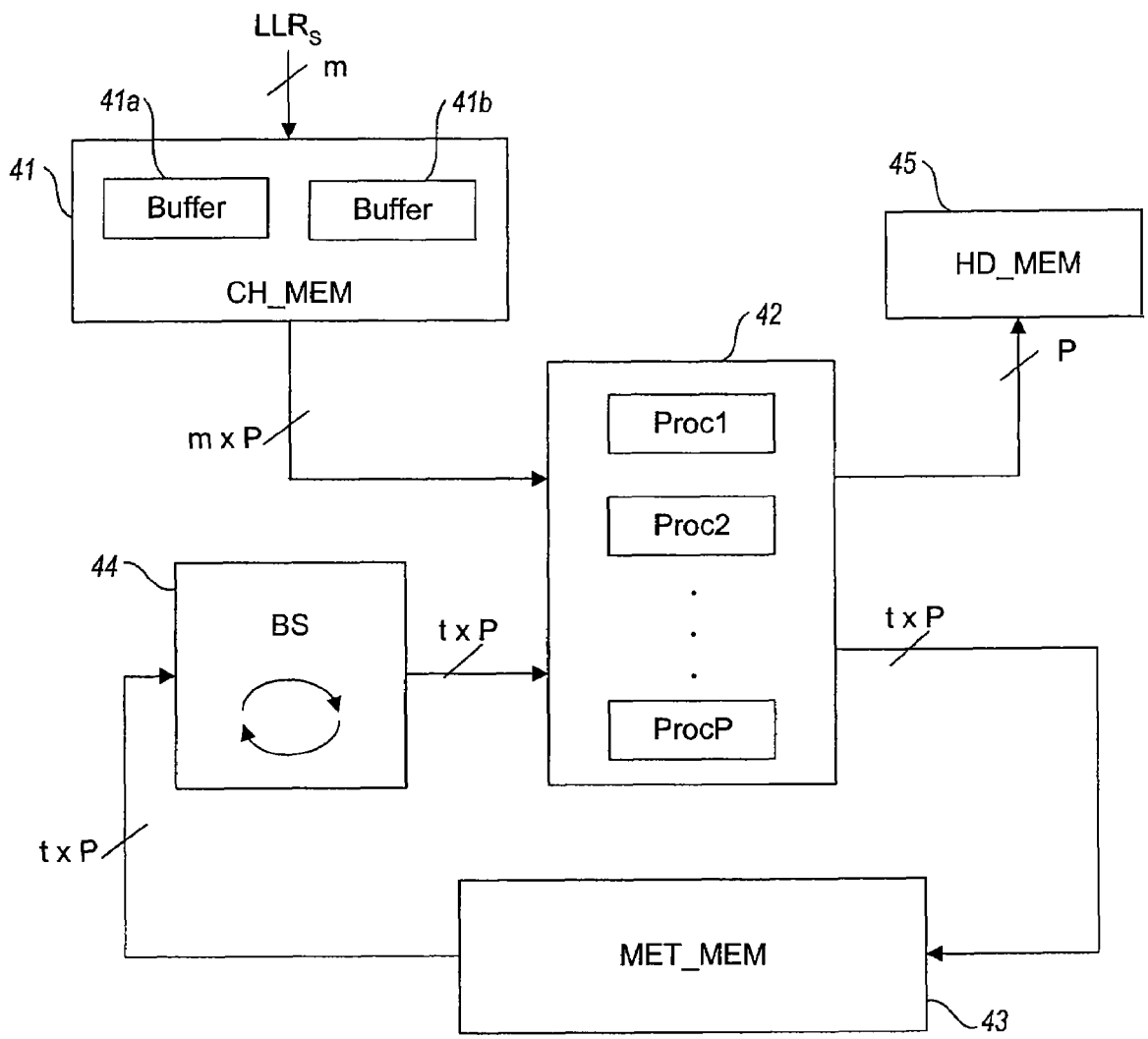
Figure 5:
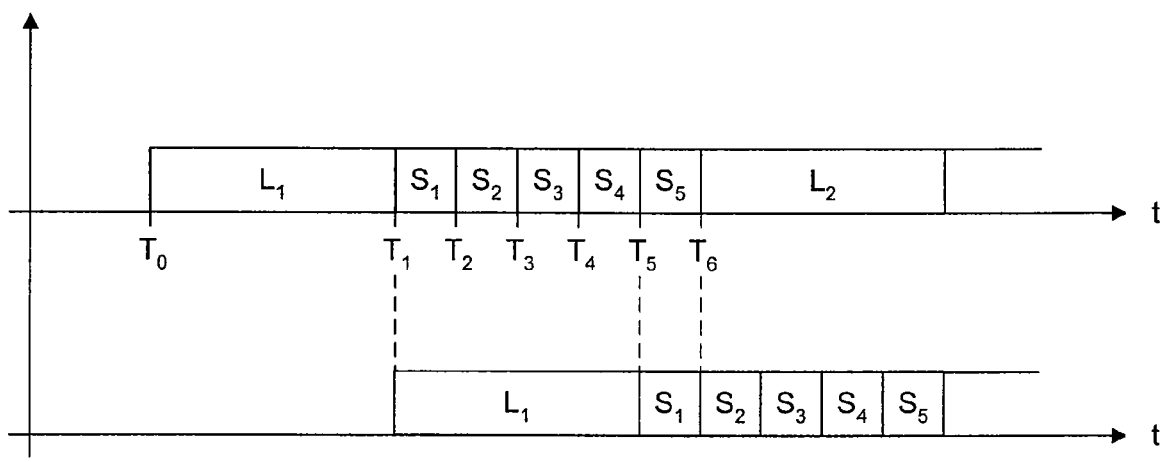
Figure 6:
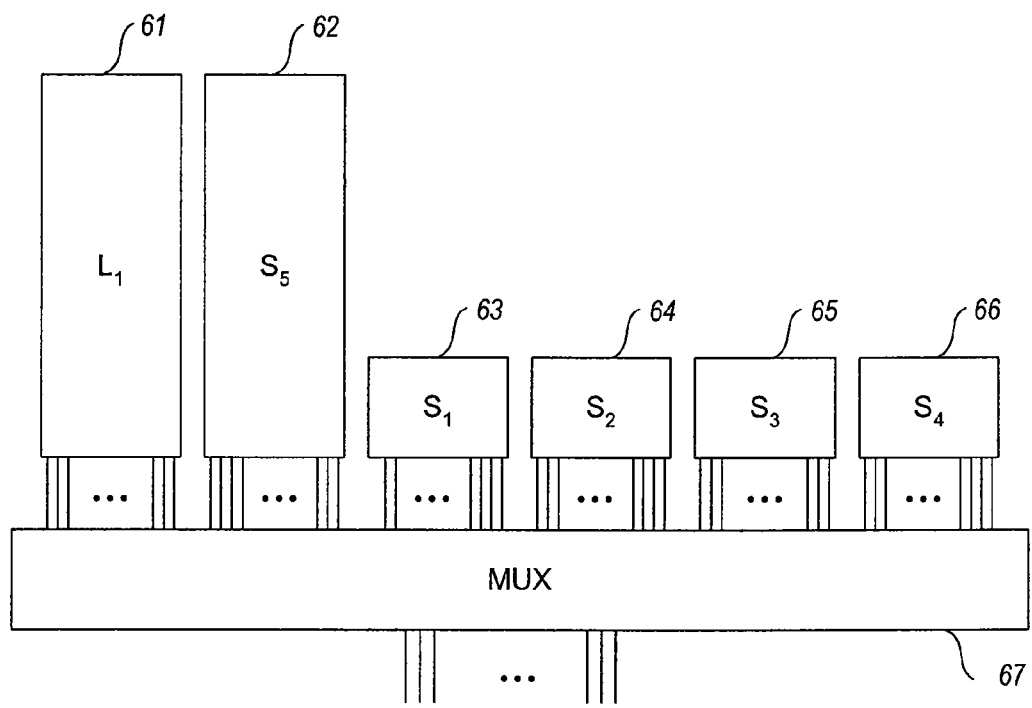

The decoder represented in FIG. 4 may be used, except that the channel memory at present comprises three storage elements. The decoding device includes means of processing the received blocks, for example, but in a non-limiting way, a bank of P processors, a loop and a decision memory at the output of the processing means to temporarily store the value of the decoded bits. The loop includes a memory for storing intermediate data originating from the processing means, and a mixer for preparing data to be processed by the processing means based on the intermediate data. Naturally, this implementation of the block decoding method would not limit the invention.

The storage device may also include a storage element management memory (not represented) to implement the algorithm of FIG. 8. The storage element management memory may include a first table for temporarily storing the values of the first variable buffer_w. The storage element management memory may also include a second table for temporarily storing values of the index offset_w. Each table may be used to store six values. A read pointer and a write pointer point to these values. The write pointer addresses the values of the first variable buffer_w and of the index offset_w indicating the position where a new block is stored. The read pointer addresses the values of the second variable buffer_r and of the read index offset_r indicating which block must be decoded. For storage elements comprising single-access RAMs, the processing of a stored block does not begin as long as the read and write pointers address values corresponding to one and the same storage element. This avoids reading and writing on a storage element simultaneously.

A person skilled in the art will have understood that this implementation based on tables by no means limits the present invention. For example, the storage elements may comprise dual-ported RAMs. A short block stored in such a storage element may be read while another short block is being written into this storage element. The processing latency of the short blocks may thus be relatively low.

Variants

In an alternative embodiment not shown, a counting variable nb_free_buffer is used. The value of the counting variable nb_free_buffer is representative of the number of storage elements available to store a new block. A test step on this counting variable nb_free_buffer is carried out in the case of a short block: if the value of the counting variable nb_free_buffer is greater than or equal to two, the value of the first variable is incremented modulo 3. The short block is thus stored in a new storage element. Since the number of storage elements was at least two, there is still at least one storage element available for any future long block. This method may allow, particularly when the storage elements comprise single-access RAMs, to reduce the short block processing latency. In practice, if only short blocks are received, there will always remain at least two storage elements free each time a short block is received. Consequently, the storage element will be changed for each block. The latency for decoding is then roughly equal to the latency corresponding to the storage of a short block and not to the latency corresponding to the storage of a long block. Furthermore, it may be that a stored block, for example an invalid block, does not require decoding. The storage element may be released immediately and the processing latency of the subsequent blocks is reduced.

The number of storage elements structured to simultaneously store a number of blocks of the second category is at least two. These storage elements may store blocks of the first category or blocks of the second category. The last storage element is dedicated to storing blocks of the first category only. The storage element management algorithm is then different from that of the embodiment illustrated in FIGS. 7 to 9, in which the storage elements were undifferentiated. For example, if the received block is long, it is stored as a priority in the last storage element. If the block is short, an index representative of the fill ratio of the blocks and a variable representative of the availability of the blocks may be used to determine in which block, out of the two blocks structured to simultaneously store a number of blocks of the second category, the short block will be stored.

Furthermore, the second category may correspond to a number of block sizes. The blocks may thus be likely to be of more than two different sizes. For example, the received blocks may be long blocks of 64800 LLRs, short blocks of 16200 LLRs, or very short blocks of 8100 LLRs.

In this case, the channel memory may, for example, comprise three storage elements having a size suitable for storing a block of the first category. These elements may all be structured to simultaneously store a number of blocks of the second category. The storage elements may be structured in subspaces, each subspace being capable of storing a smaller size block of the second category, or in this example, a very short block. The storage elements may, for example, each comprise eight subspaces. A short block occupies two subspaces, whereas a very short block occupies only one subspace. When a short block is stored in a storage element, the index may be incremented by two. In the prior art, for blocks of 64800 LLRs, 16200 LLRs and 8100 LLRs, or block size ratios of 4 and 8, fourteen storage elements are needed.

Furthermore, the first block size may be less than two times greater than a second block size. For example, the first category may correspond to a first block size of 64800 LLRs and a second category to a second block size of 48600 LLRs. The ratio of the values of the sizes that the blocks are likely to take is in this case ¾. The storage device then comprises three storage elements having a size suitable for storing a block of the first category, and structured to store either a block of the first category, or a block of the second category. A storage device of the prior art suitable for such block sizes comprises two storage elements having a size suitable for storing a block of the first category and three storage elements having a size suitable for storing a block of the second category, or five storage elements. The storage device according to this embodiment thus comprises a relatively low number of storage elements.

In most of the examples mentioned, the block size ratios are integer numbers. This characteristic should not limit the invention. For example, the blocks may be likely to be of a first size of 72900 LLRs and a second size of 16200 LLRs. In this case, it is possible to have two storage elements with a storage capacity of 72900 LLRs and one storage element of 64800 LLRs. The three storage elements are structured to store a number of blocks of 16200 LLRs simultaneously. In practice, the conventional implementations of the block encoding algorithms normally provide integer block size ratios.

Furthermore, the claimed subject matter is not limited by the exemplary decoding device described. In particular, it is not necessary for the decoding algorithm to be iterative. The decoding device need not include a loop. For example, in the case of blocks likely to be of relatively large sizes, for example counted in hundreds of thousands of bits, and for a relatively low parallelism index, for example of around one hundred, it may be necessary to retain the values of the bits of a given block for a certain time while a new block is being received. The claimed subject matter may therefore be applied to such an example.

As a general rule, it should be remembered that the invention is not limited to LDPC decoding and that the invention can be applied to other block decoding algorithms, for example the block turbocodes or the BCH codes.

From the foregoing it will be appreciated that, although specific embodiments have been described herein for purposes of illustration, various modifications may be made without deviating from the spirit and scope of the invention. Accordingly, the invention is not limited except as by the appended claims.

The invention claimed is:

1. A device for storing blocks of bits to be decoded according to a block decoding algorithm, the blocks being likely to belong to a given category out of a first category and a second category, the first category corresponding to a first block size, the second category corresponding to at least one second block size less than said first block size, said storage device comprising:
three storage elements having a size suitable for storing one block of the first category each, and at least two of which are structured to store either one block of the first category, or one block of the second category or a number of blocks of the second category simultaneously.

2. The storage device of claim 1, wherein
each of the three storage elements is structured to store either one block of the first category, or one block of the second category or a number of blocks of the second category simultaneously.

3. The storage device of claim 1, wherein the second category corresponds to a single second block size.

4. The storage device of claim 1, wherein the first block size is at least two times greater than said at least one second block size; and said at least two storage elements are structured to store either one block of the first category or a number of blocks of the second category simultaneously.

5. The storage device according to claim 4, wherein the three storage elements are structured to store either one block of the first category, or a number of blocks of the second category simultaneously; and the three storage elements are structured as a plurality of subspaces, each subspace being able to store a smaller size block of the second category.

6. The storage device according to claim 1, wherein the block decoding algorithm includes an LDPC decoding algorithm.

7. A system for decoding blocks of bits according to a block-mode channel decoding algorithm, comprising:
a device for storing blocks of bits to be decoded according to a block decoding algorithm, the blocks being likely to belong to a given category out of a first category and a second category, the first category corresponding to a first block size, the second category corresponding to at least one second block size less than said first block size, said storage device including:
three storage elements having a size suitable for storing one block of the first category each, and at least two of which are structured to store either one block of the first category, or one block of the second category or a number of blocks of the second category simultaneously;
a bank of processors for processing the received blocks;
a loop that includes:
a memory for storing intermediate data originating from the bank of processors; and
a mixer for preparing data to be processed by the bank of processors from the intermediate data; and
a decision memory for temporarily storing the decoded bits.

8. The system of claim 7, wherein each of the three storage elements is structured to store either one block of the first category, or one block of the second category or a number of blocks of the second category simultaneously.

9. The system of claim 7, wherein the three storage elements are structured to store either one block of the first category, or a number of blocks of the second category simultaneously; and the three storage elements are structured as a plurality of subspaces, each subspace being able to store a smaller size block of the second category.

10. A method for storing blocks of bits to be decoded according to a block decoding algorithm, the blocks being likely to belong to a given category out of a first category and a second category, the first category corresponding to a given block size, the second category corresponding to at least one second block size less than said first block size, said method comprising:
providing three storage elements, each having a size suitable for storing one block of the first category, and at least two of which are structured to store either one block of the first category, or one block of the second category or a number of blocks of the second category simultaneously; and
for each new block, choosing one of the three storage elements to store the new block, wherein the chosen storage element is chosen based on a size of the new block.

11. The method of storing blocks of bits of claim 10, further comprising:
for each new block belonging to the second category, choosing one of the at least two storage elements structured to store simultaneously a number of blocks of the second category, wherein the chosen storage element is chosen based on an index, the index being representative of a fill ratio of the at least two storage elements.

12. A method for storing blocks of bits intended to be decoded according to a block decoding algorithm, the blocks being likely to belong to a given category out of a first category and a second category, the first category corresponding to a first given block size, the second category corresponding to at least one second given block size less than said first block size, said method comprising:
providing three storage elements, each having a size suitable for storing one block of the first category, and at least two of which are structured to store either one block of the first category, or one block of the second category or a number of blocks of the second category simultaneously;
receiving new blocks to be stored;

for each new received block belonging to the first category, storing the block in an empty storage element from among the three storage elements; and for each new received block belonging to the second category, storing the block in either an empty storage element from among the three storage elements or in a partially-filled storage element from among the at least two storage elements.

13. The method of claim 12 wherein storing a new block belonging to the second category comprises utilizing an index, the value of the index being representative of the fill ratio of at least one of the at least two storage elements.

14. The method of claim 12 wherein storing a new block belonging to the second category comprises utilizing a counting variable, the value of the counting variable being representative of the number of storage elements available to store a new block.

15. A device for storing blocks of bits intended to be decoded according to a block decoding algorithm, the blocks being likely to belong to a given category out of a first category and a second category, the first category corresponding to a first given block size, the second category corresponding to at least one second given block size less than said first block size, said storage device comprising:

three storage elements having a size suitable for storing one block of the first category each, and at least two of which are structured to store either one block of the first category, or one block of the second category or a number of blocks of the second category simultaneously; and a storage element management memory comprising:
   a first table for storing at least one value of a first variable, the at least one value of the first variable representing the storage element chosen to store a received block; and
   a second table for storing at least one value of a first index, the at least one value of the first index representing a fill ratio of at least one of the at least two storage elements.

16. The device of claim 15, wherein the first table of the storage element management memory further comprises at least one value of a second variable, the at least one value of the second variable representative of the storage element from which the stored bits are read, and wherein the second table of the storage element management memory further comprises at least one value of a second index, the at least value of the second index representative of the position in the storage element from which the bits are read.

* * * * *

UNITED STATES PATENT AND TRADEMARK OFFICE
CERTIFICATE OF CORRECTION

PATENT NO. : 7,640,482 B2  Page 1 of 1
APPLICATION NO. : 11/470982
DATED : December 29, 2009
INVENTOR(S) : Paumier et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 757 days.

Signed and Sealed this

Ninth Day of November, 2010

David J. Kappos
*Director of the United States Patent and Trademark Office*